(12) United States Patent
Scilla

(10) Patent No.: US 6,266,221 B1
(45) Date of Patent: Jul. 24, 2001

(54) PROCESS-INDEPENDENT THERMAL PROTECTION CIRCUIT FOR MICROELECTRONIC CIRCUITS

(75) Inventor: Giuseppe Scilla, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/429,577

(22) Filed: Oct. 28, 1999

(30) Foreign Application Priority Data

Oct. 29, 1998 (IT) .............................................. MI98A2322

(51) Int. Cl.⁷ ...................................................... H02H 5/04
(52) U.S. Cl. .......................................... 361/103; 361/93.8
(58) Field of Search ..................... 361/103, 106, 361/78, 93.8

(56) References Cited

U.S. PATENT DOCUMENTS

| | | | |
|---|---|---|---|
| 5,563,760 | * | 10/1996 | Lowis et al. .......................... 361/103 |
| 5,638,246 | * | 6/1997 | Sakamoto et al. ................... 361/103 |
| 5,642,252 | * | 6/1997 | Sakamoto et al. ................... 361/93.9 |

* cited by examiner

*Primary Examiner*—Michael J. Sherry
(74) *Attorney, Agent, or Firm*—Jenkens & Gilchrist, P.C.

(57) ABSTRACT

A process-independent thermal protection circuit for microelectronic circuits is disclosed, including a thermal ramp generator suitable to generate a first thermal ramp signal and a second thermal ramp signal, a differentiator suitable to determine the difference between the first and second thermal ramp signals in order to generate a difference voltage signal, and a comparator suitable to compare the difference voltage signal with a reference voltage signal in order to assert a thermal protection signal when the difference voltage signal drops below the reference voltage signal.

21 Claims, 4 Drawing Sheets

PROCESS-INDEPENDENT THERMAL PROTECTION CIRCUIT FOR MICROELECTRONIC CIRCUITS

BACKGROUND OF THE INVENTION

1. Technical Field of the Invention

The present invention relates to a process-independent thermal protection circuit for microelectronic circuits.

2. Description of Related Art

It is known that microelectronic circuits are provided with thermal protection in order to protect their operation if the temperature rises above a predetermined threshold temperature.

These thermal protection circuits generally use the temperature-dependent variation of an implantation resistor, coupled to the variation of a voltage between the base and the emitter of a bipolar transistor.

The coupling can be direct, i.e., the resistor is connected between the base and the emitter of the bipolar transistor. FIG. 1 illustrates a direct coupling configuration, in which resistor RT is the resistor coupled between the base and the emitter of the bipolar transistor 1.

FIG. 2 shows an example of an indirect coupling configuration, in which a comparator 2 detects the positive variation of the voltage on one side caused by the resistor RT, and the negative variation on the other side caused by one or more diodes 3 and 4.

Usually, especially in processes with high production capacities, control of process-related characteristics is unreliable, resulting in the resistance of resistor RT varying considerably between different batches and throughout the years of product production. Statistical estimates confirm resistance variations on the order of plus or minus 10%.

Moreover, two or three tests with different contacts are usually performed in order to calibrate a thermal protection. These tests slow the development of the device, especially when this is done by using lines which are not dedicated to development.

SUMMARY OF THE PRESENT INVENTION

The aim of the present invention is to provide a thermal protection circuit for microelectronic circuits which is substantially process-independent.

Within the scope of this aim, a preferred embodiment the present invention is a thermal protection circuit for microelectronic circuits which substantially completely eliminates the uncertainty of process-dependent variations in a temperature sensing resistor.

The preferred embodiment of the present invention allows for the simple selection of a triggering temperature level.

The preferred embodiment of the present invention is highly reliable and relatively easy to produce at competitive costs.

This aim and others which will become apparent hereinafter are achieved by a process-independent thermal protection circuit for microelectronic circuits, characterized in part by including a thermal ramp generator suitable to generate a first thermal ramp signal and a second thermal ramp signal, a differentiator suitable to determine the difference between the first and second thermal ramp signals in order to emit a difference voltage signal, and a comparator suitable to compare the difference voltage signal with a reference voltage signal in order to activate a thermal protection signal when the difference voltage signal drops below the reference voltage signal.

BRIEF DESCRIPTION OF THE DRAWINGS

Further characteristics and advantages will become apparent from the following detailed description of a preferred but not exclusive embodiment of the circuit according to the invention, illustrated only by way of non-limitative example in the accompanying drawings, wherein.

In all the Figures, identical reference numerals designate identical elements.

DESCRIPTION OF THE PREFERRED EMBODIMENTS

Figure 1:
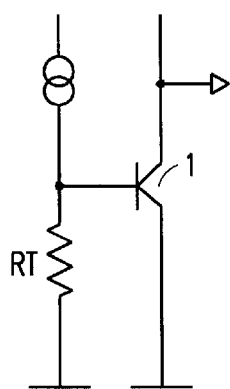
FIG. 1 is a circuit diagram of a conventional thermal protection circuit.
Figure 2:
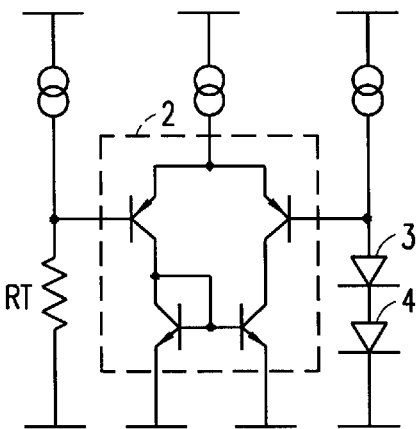
FIG. 2 is a circuit diagram of another conventional thermal protection circuit.
Figure 3:
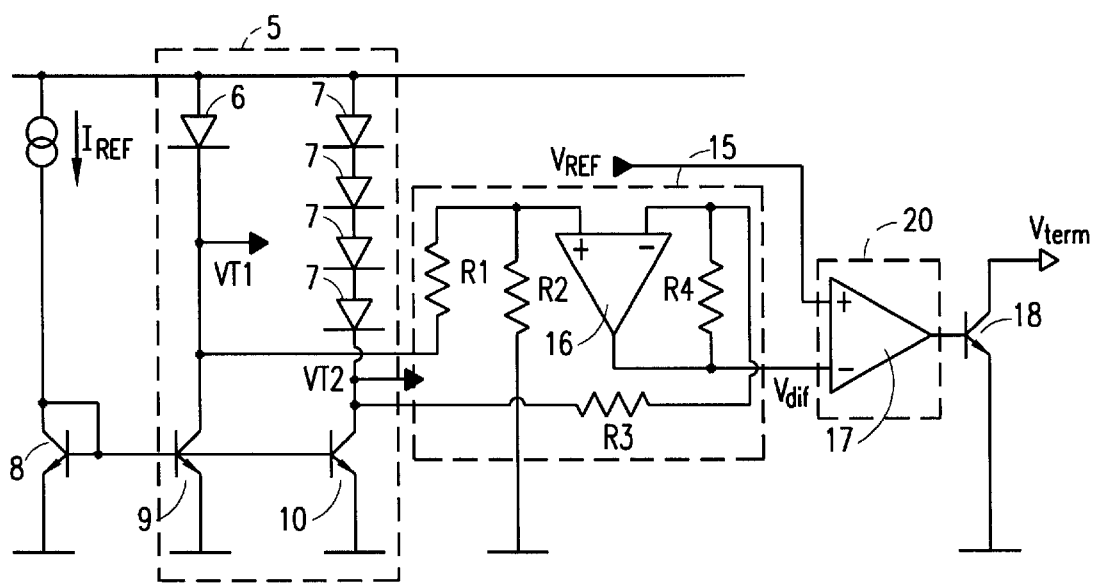
FIG. 3 is a circuit diagram of the thermal protection circuit according to an embodiment of the present invention.

Since FIGS. 1 and 2 have already been described, they are not discussed further and accordingly reference is made only to FIG. 3, which illustrates the circuit according to an embodiment of the present invention.

The circuit includes a thermal ramp generator for generating thermal ramp signals, generally designated by the reference numeral 5, having a first circuit branch with a diode 6 and a second circuit branch with a plurality of series-connected diodes. In the case of FIG. 3 there are four series-connected diodes 7, but the number of diodes can vary according to the setting chosen for thermal intervention at which the present protection circuit is triggered or otherwise asserts a protection signal. Each diode 6 and 7 preferably includes a p-n junction.

Figure 4:
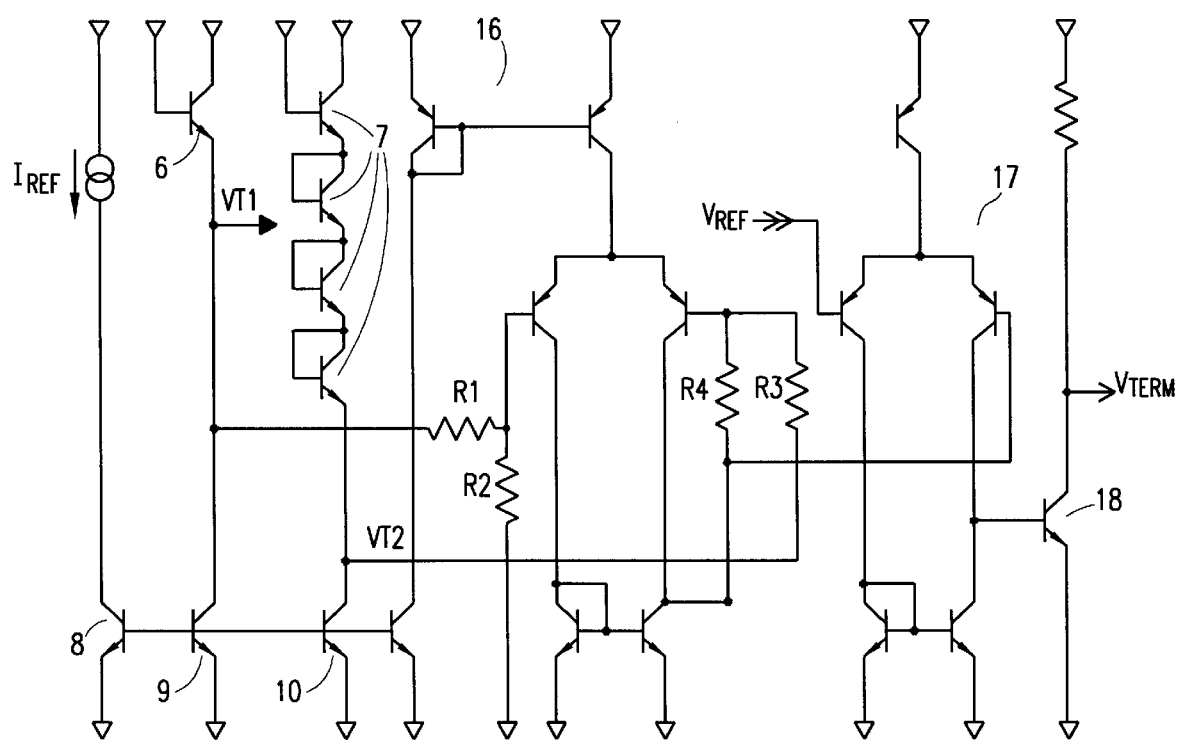
FIG. 4 is a transistor diagram of the thermal protection circuit according to a variation of the embodiment of the present invention shown in FIG. 3.

It is understood that other active elements whose performance is affected by temperature may be used in place of diodes 6 and series-connected diodes 7. For example, bipolar transistors that are configured as diodes may be used in place of diodes 6 and 7. FIG. 4 illustrates a circuit diagram of the present circuit having diodes 6 and 7 configured as bipolar transistors.

The first and second circuit branches of the thermal ramp generator 5 are each supplied a reference current $I_{ref}$ which is mirrored by a current mirror in the first and second branches of the thermal ramp generator 5.

The current mirror circuit is formed by bipolar transistors 8, 9 and 10, connected respectively between the reference current source $I_{ref}$ and ground, between diode 6 and ground, and between the plurality of series-connected diodes 7 and ground. The current $I_{ref}$ flowing through transistor 8 of the first stage of the current mirror is mirrored in transistors 9 and 10 of the second stages.

The first circuit branch, which includes diode 6, generates a first thermal voltage signal VT1, while the second circuit branch, which includes the series-connected diodes 7, generates a second thermal voltage signal VT2. Thermal voltage signals VT1 and VT2 are fed to a differentiator, generally designated by the reference numeral 15, which includes an operational amplifier 16 that receives thermal voltage signals VT2 and VT1 respectively at the inverting and noninverting inputs thereof.

Two resistors R1 and R2 are respectively connected in parallel to the noninverting input of the operational amplifier 16. The resistor R1 is connected to the first branch of the thermal ramp generator 5 and particularly to the cathode of diode 6.

Likewise, a second pair of resistors R3 and R4 is connected to the inverting input of the operational amplifier 16.

The resistor R3 is connected to the second circuit branch of the thermal ramp generator 5 and particularly to one end of series-connected diodes 7.

The output Vdif of differentiator 15, represented as the output voltage signal Vdif of the differentiator 15, is fed to comparator 20, which compares signal Vdif with a reference voltage Vref. In particular, the voltage signal Vdif is fed to the inverting input of operational amplifier 17, and the reference voltage Vref is fed to the noninverting input thereof.

A bipolar transistor 18 is cascade-connected to the comparator 16 and is driven thereby.

The thermal ramp generator 5 utilizes the thermal variation of the voltage between the anode and the cathode of the diode 6 with respect to the much larger variation of the chain of four series-connected diodes 7 (the number of diodes 7, as mentioned, can vary according to requirements). Whereas in the exemplary protection circuit of FIG. 3 the thermal variation of the voltage between the anode and the cathode of the diode 6 is approximately −1.8 mv per ° C., the chain of series-connected diodes 7 generates four times this variation, i.e., approximately 7.2 mv per ° C.

Figure 5:
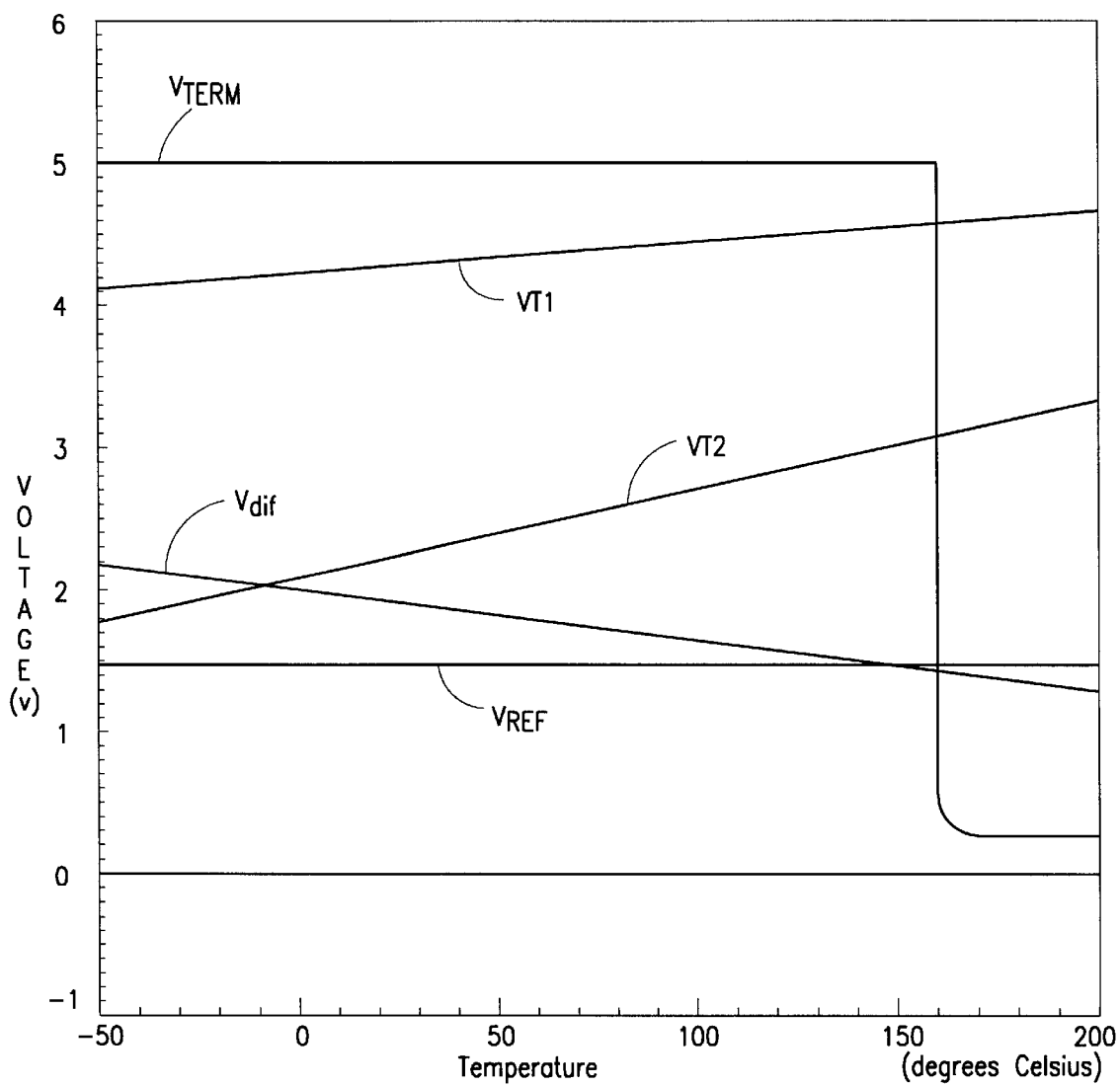
FIG. 5 is a plot of various voltage signals of the thermal protection circuit of FIG. 3 over temperature.

FIG. 5 is a graph illustrating the operation of the present invention. Specifically, FIG. 5 shows how voltage signals VT1 and VT2 increase with an increase in temperature, and that voltage signal VT2 increases at a faster rate than voltage signal VT1 as the temperature increases (i.e., voltage signal VT2 has a greater slope than voltage signal VT1 over temperature). As can be seen, the voltage signal Vdif steadily decreases as the temperature increases. When the voltage differential between voltage signals VT1 and VT2 approaches a predetermined value such that voltage signal Vdif falls below reference voltage Vref, in this case at approximately 155° C., the output of comparator 20 is driven to a high voltage level which turns on transistor 18 and causes Vterm to fall.

The slopes of the thermal ramp signals are positive because they are referenced to the supply voltage, which is set to 5v for exemplary purposes. However, it is advisable to connect the chain of series-connected diodes 7 to an internal reference between 3v (not shown) and 5v. The internal reference may be provided, for example, by a Zener diode (not shown).

The slope obtained as a difference, in the differentiator 15, of the two above mentioned slopes can be employed for the intended thermal intervention by the present protection circuit.

Figure 6:
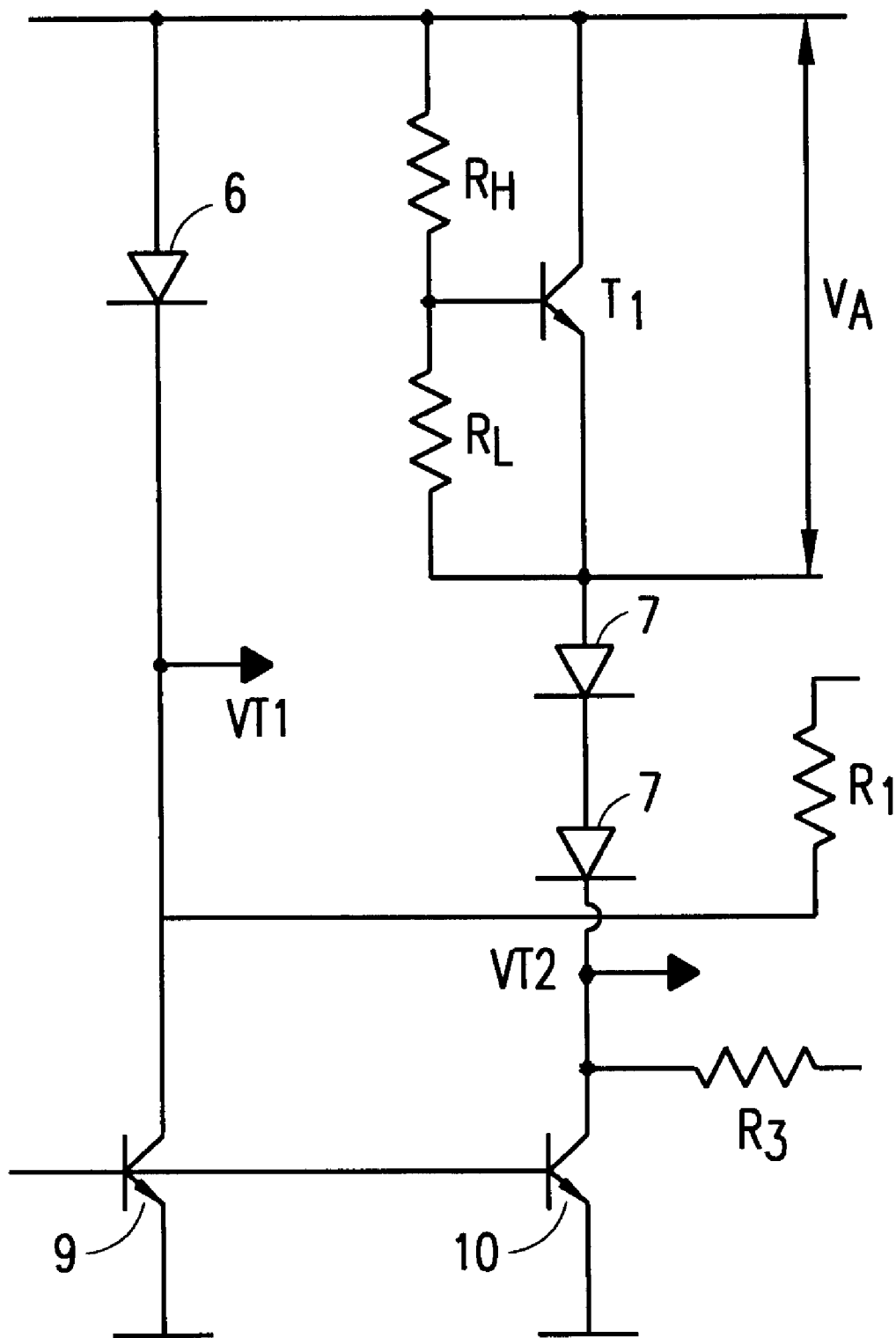
FIG. 6 is a circuit diagram of a portion of the thermal protection circuit according to a second embodiment of the present invention.

It should be observed that it is also possible to trigger thermal intervention based upon techniques other than the difference between voltage drops along two sets of diodes. For example, an amplifier and/or multiplier may be employed which multiplies the voltage between the anode and the cathode of one or more diode 7 in the second circuit branch of the ramp generator 5. FIG. 6 illustrates a circuit in which the second circuit branch includes resistors $R_H$ and $R_L$ formed as a voltage divider. In this configuration, the voltage across resistor $R_H$ is added to the voltage across the base-emitter terminals of transistor T1 and the voltage across diodes 7 to form signal VT2. The voltage across resistor $R_H$ may be set based upon the resistance values selected for resistors $R_H$ and $R_L$.

Alternatively, a number of diodes that is different from the number of series-connected diodes 7 shown in FIG. 3 may be utilized in the second circuit branch of ramp generator 5, depending on how the thermal intervention is desired to be set.

A further refinement of the embodiment of the present circuit thermal protection circuit can be achieved by appropriately setting the currents in resistors R1–R4. Although resistors R1–R4 can be affected by process variations, resistors R1–R4 have no first-order temperature effect because Resistors R1–R4 are configured as voltage dividers with matching and/or mutually identical resistances.

The signal obtained at the output of the differentiator 15 and the reference voltage Vref are applied to the comparator 20. When the difference voltage Vdif drops below the reference voltage Vref, thermal intervention is triggered and thermal protection is enabled.

In practice it has been observed that the thermal protection circuit according to the present invention allows the thermal protection provided in microelectronic circuits to be substantially independent of the variation in the absolute value of the thermal sensing resistor normally used in conventional circuits.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A substantially process-independent thermal protection circuit for microelectronic circuits, comprising:

a thermal ramp generator suitable to generate a first thermal ramp signal and a second thermal ramp signal, the first and second thermal ramp signals having different thermal effects;

a differentiator suitable to determine the difference between said first and second thermal ramp signals and to generate a difference voltage signal based upon the difference; and a comparator suitable to compare said difference voltage signal with a reference voltage signal in order to assert a thermal protection signal when said difference voltage signal drops below said reference voltage signal, the asserted thermal protection signal indicating a temperature exceeding a predetermined temperature level.

2. The thermal protection circuit according to claim 1, wherein said thermal ramp generator comprises;

a first circuit branch, including a diode whose anode-cathode voltage drop varies with temperature; and a second circuit branch, including a chain of series-connected diodes, each diode in the chain having an anode-cathode voltage drop that varies with temperature, said first and second circuit branches respectively generating said first and second thermal ramp signals.

3. The thermal protection circuit according to claim 1, wherein:

said differentiator comprises an operational amplifier in which a first pair of resistors is connected to the noninverting input thereof and a second pair of resistors is connected to the inverting input of the operational amplifier.

4. The thermal protection circuit according to claim 3, wherein:

a first resistor of said first pair of resistors is connected to said first circuit branch and a second resistor of said first pair of resistors is connected to ground.

5. The thermal protection circuit according to claim 3, wherein:

a first resistor of said second pair of resistors is connected to said second circuit branch of said ramp generator and a second resistor of said second pair of resistors is feedback-connected between the output of said operational amplifier of said differentiator and the inverting input thereof.

6. The thermal protection circuit according to claim 1, wherein:

said comparator comprises an operational amplifier having a noninverting input connected to a reference voltage and an inverting input connected to the difference voltage signal.

7. The thermal protection circuit according to claim 1, further comprising:

a bipolar transistor which is cascade-connected to said comparator and driven thereby.

8. The thermal protection circuit according to claim 1, wherein:

said first and second branches of said thermal ramp generator each includes a transistor forming a portion of a current mirror.

9. The circuit according to claim 1, wherein:

each first and second branch of said thermal ramp generator is provided with a reference current.

10. A method for detecting an operating temperature of an integrated circuit exceeding a predetermined temperature level, comprising the steps of:

generating a first thermal ramp signal and a second thermal ramp signal having electrical characteristics which vary depending upon the operating temperature of the integrated circuit, the extent of variation of the first thermal ramp signal being different from the extent of variation of the second thermal ramp signal;

determining a difference between said first thermal ramp signal and said second thermal ramp signal and generating a difference signal based upon the difference; and comparing said difference signal with a reference voltage in order to assert a thermal protection signal indicative of the operating temperature of the integrated circuit exceeding the predetermined temperature level, when said difference signal is lower than said reference voltage.

11. The method according to claim 10, wherein said first and second thermal ramp signals are obtained by detecting the voltage variation between the voltage drop across a diode and the voltage drop across a plurality of series-connected diodes.

12. The method according to claim 11, wherein the number of said plurality of diodes is chosen according to the intended maximum operating temperature of the integrated circuit.

13. A protection circuit for detecting an operating temperature of an integrated circuit exceeding a predetermined maximum operating temperature, comprising:

a first circuit for generating a first signal and a second signal, the first and second signals each varying based upon the operating temperature of the integrated circuit, an extent of variation of the first signal due to the operating temperature being different from the extent of variation of the second signal due to the operating temperature;

a second circuit, connected to the first circuit, for generating a third signal corresponding to a difference between the first signal and the second signal; and a third circuit, connected to the second circuit, for comparing the third signal to a reference voltage, and generating a fourth signal based upon the comparison, the fourth signal indicating the operating temperature of the integrated circuit exceeding the predetermined maximum operating temperature.

14. The protection circuit of claim 13, wherein the first circuit comprises a first branch circuit for generating the first signal, including a first diode; and a second branch circuit for generating the second signal, including a chain of series connected diodes wherein the voltage across each diode in the chain varies based upon the operating temperature of the integrated circuit.

15. The protection circuit of claim 14, wherein:

the first circuit includes a first transistor connected to the first diode for providing a reference current through the first diode; and the second circuit includes a second transistor connected to the chain of series-connected diodes for providing the reference current thereto.

16. The protection circuit of claim 15, wherein:

the first and second transistors each form a second stage of a current mirror circuit.

17. The protection circuit of claim 13, wherein the first circuit comprises:

a first branch circuit for generating the first signal, including one or more active electrical components, each electrical component having an electrical characteristic that varies based upon the operating temperature of the integrated circuit; and a second branch circuit for generating the second signal, including a plurality of the active electrical components, a number of active electrical components in the second branch circuit being different from the number of active electrical components in the first circuit branch.

18. The protection circuit of claim 17, wherein:

each active electrical component comprises a diode.

19. The protection circuit of claim 17, wherein:

each active electrical component includes a p-n junction.

20. The protection circuit of claim 13, wherein the first circuit comprises:

a first circuit branch includes at least one first active element having an electrical characteristic that varies with temperature, the first circuit branch generating the first signal; and a second circuit branch includes at least one second active element having an electrical characteristic that varies with temperature, the second circuit branch generating the second signal.

21. The protection circuit of claim 20, wherein:

the first active element and the second active elements each comprise at least one diode.

* * * * *